(12) United States Patent
Nakagawa et al.

(10) Patent No.: US 8,723,412 B2
(45) Date of Patent: May 13, 2014

(54) WHITE LIGHTING DEVICE

(75) Inventors: Katsutoshi Nakagawa, Yokohama (JP); Yumi Ito, Yokohama (JP); Masahiko Yamakawa, Yokohama (JP)

(73) Assignees: Kabushiki Kaisha Toshiba, Tokyo (JP); Toshiba Materials Co., Ltd., Yokohama-shi (JP)

( * ) Notice: Subject to any disclaimer, the term of this patent is extended or adjusted under 35 U.S.C. 154(b) by 43 days.

(21) Appl. No.: 13/609,845

(22) Filed: Sep. 11, 2012

(65) Prior Publication Data

US 2013/0241394 A1    Sep. 19, 2013

Related U.S. Application Data

(63) Continuation of application No. PCT/JP2011/001338, filed on Mar. 7, 2011.

(30) Foreign Application Priority Data

Mar. 12, 2010  (JP) ................ P2010-055888

(51) Int. Cl.
*H01J 1/62* (2006.01)
(52) U.S. Cl.
USPC .................. 313/503; 252/301.4 R
(58) Field of Classification Search
USPC ............. 313/498–512; 252/301.4 R
See application file for complete search history.

(56) References Cited

U.S. PATENT DOCUMENTS 8,288,937 B2 * 10/2012 Ishii et al. ............ 313/503
8,482,191 B2 * 7/2013 Berben et al. .......... 313/502
2004/0007961 A1  1/2004 Srivastava et al.
2007/0259206 A1 * 11/2007 Oshio ..................... 428/690
2008/0122343 A1 * 5/2008 Maruyama et al. ....... 313/503
2010/0322275 A1  12/2010 Ishii et al.

FOREIGN PATENT DOCUMENTS

| JP | 2004-501512 | 1/2004 |
| JP | 2007-109837 | 4/2007 |
| JP | 2007-332217 | 12/2007 |
| JP | 2008-187188 | 8/2008 |
| WO | WO 2008/020541 A1 | 2/2008 |
| WO | WO 2008/096545 A1 | 8/2008 |
| WO | WO 2009/099234 A1 | 8/2009 |

OTHER PUBLICATIONS

Japanese Industrial Standard, "Methods for determining distribution temperature and color temperature or correlated color temperature of ligth sources", JIS Z 8725, ICS 17.180.20, 1999, 44 pages (in Japanese).

(Continued)

*Primary Examiner* — Anne Hines
(74) *Attorney, Agent, or Firm* — Oblon, Spivak, McClelland, Maier & Neustadt, L.L.P.

(57) ABSTRACT

According to the embodiment, a white lighting device includes a semiconductor light-emitting element emitting near-ultraviolet light, and a phosphor layer containing at least a blue-green phosphor emitting blue-green light and a red phosphor emitting red light and emits white light having a correlated color temperature of 5000 K or less and a deviation duv from a blackbody locus of not less than −0.01 nor more than 0.01, in which a ratio of a content of the red phosphor to a content of the blue-green phosphor in the phosphor layer by mass is not less than 35 nor more than 50.

10 Claims, 2 Drawing Sheets

(56) References Cited

OTHER PUBLICATIONS

Japanese Industrial Standard, "Method of Specifying Colour Rendering Properties of Light Sources", JIS Z 8726, UDC 535.665:628.981, 1990, 21 pages (in English).
International Search Report mailed May 24, 2011 in PCT/JP2011/001338 filed Mar. 7, 2011 (with English Translation).
International Written Opinion mailed May 24, 2011 in PCT/JP2011/001338 filed Mar. 7, 2011.
Japanese Industrial Standard, "Method of Specifying Colour Rendering Properties of Light Sources", JIS Z 8726, UDC 535.665:628.981, 1990, 22 pages.
"Methods for determining distribution temperature and color temperature or correlated color temperature of light sources", Z 8725, 1999, 42 pages.
International Preliminary Report on Patentability and Written Opinion issued Oct. 2, 2012 in PCT/JP2011/001338 filed on Mar. 7, 2011.

* cited by examiner

WHITE LIGHTING DEVICE

CROSS-REFERENCE TO RELATED APPLICATIONS

This application is a continuation of prior International Application No. PCT/JP2011/001338 filed on Mar. 7, 2011, which is based upon and claims the benefit of priority from Japanese Patent Application No. 2010-055888 filed on Mar. 12, 2010; the entire contents of all of which are incorporated herein by reference.

FIELD

Embodiments described herein relate generally to a white lighting device.

BACKGROUND ART

In recent years, a high efficiency white lighting device in which a semiconductor light-emitting element such as a light-emitting diode (LED) and a phosphor to emit light by being excited with light emitted from the semiconductor light-emitting element are combined has been commercialized. Such a white lighting device using the semiconductor light-emitting element is high efficiency as compared with a conventional white lighting device such as an incandescent lamp or a fluorescent lamp to thus greatly contribute to saving of energy.

Incidentally, in applications of special lighting such as medical lighting, lighting for jewelry goods, lighting for foods, and lighting for photographing, which is necessary to be close to the visibility of colors under natural light, it is required to have a high color rendering property, but the white lighting device using the semiconductor light-emitting element does not necessarily have a sufficient color rendering property. By improving the color rendering property of the white lighting device using the semiconductor light-emitting element, the use of the white lighting device using the semiconductor light-emitting element is made possible even in the applications of special lighting to make it possible to greatly contribute to saving of energy.

As a method of specifying such a color rendering property, an average color rendering index Ra and special color rendering indexes R9 to R15 are cited. When the average color rendering index Ra and the special color rendering indexes R9 to R15 are each close to 100, the color rendering property becomes suitable in the applications of special lighting. Particularly, the special color rendering index R9 is to specify the visibility of red, and it is said that as the special color rendering index R9 is close to 100, the expressiveness of red is high.

In the color rendering method in JIS, lamps called a high color rendering type are classified into three ranks of color rendering A, color rendering AA, and color rendering AAA. In order to substitute the white lighting device using the semiconductor light-emitting element for the lamps with color rendering AA and more among them, the average color rendering index Ra is required to be about 85 or more, and is more preferably required to be 90 or more. Further, in order to express red with good reproducibility, the special color rendering index R9 is required to be about 85 or more, and is more preferably required to be 90 or more.

The white lighting devices each using the above-described semiconductor light-emitting element, particularly a light-emitting diode, are roughly classified into ones each using a blue light-emitting diode emitting blue light and ones each using a near-ultraviolet light-emitting diode emitting ultraviolet light.

As the white lighting devices each using the blue light-emitting diode among them, one combined with a yellow phosphor, and one combined with a green phosphor and a red phosphor are cited. However, the one combined with the yellow phosphor has difficulty in obtaining the average color rendering index Ra of 85 or more, and has difficulty in being used in the applications of special lighting. Further, the one combined with the green phosphor and the red phosphor can obtain the average color rendering index Ra or 85 or more, but has difficulty in obtaining the special color rendering index R9 of 85 or more and has difficulty in being used in the applications of special lighting.

On the other hand, as the white lighting devices each using the near-ultraviolet light-emitting diode, one combined with a blue phosphor, a green phosphor, and a red phosphor, and one combined with a blue phosphor, a red phosphor, and a yellow phosphor in place of the green phosphor have been known. According to the white lighting devices as above, the one having a correlated color temperature in excess of 5000 K can obtain the average color rendering index Ra and the special color rendering index R9 that are 85 or more, and can be used in the applications of special lighting. However, the white lighting device having the correlated color temperature of 5000 K or less has difficulty in obtaining the average color rendering index Ra and the special color rendering index R9 that are 85 or more, and particularly has difficulty in obtaining the special color rendering index R9 of 85 or more, and has difficulty in being used in the applications of special lighting.

DETAILED DESCRIPTION

A white lighting device in an embodiment includes: a semiconductor light-emitting element emitting near-ultraviolet light; and a phosphor layer containing a blue-green phosphor having an emission peak in a wavelength region of not less than 480 nm nor more than 520 nm, a red phosphor having an emission peak in a wavelength region of not less than 585 nm nor more than 630 nm, and two or more phosphors each having an emission peak in a wavelength region other than the wavelength regions. The white lighting device in the embodiment emits white light having a correlated color temperature of 5000 K or less and a deviation duv from a blackbody locus of not less than −0.01 nor more than 0.01. The white lighting device in the embodiment has a ratio of a content of the red phosphor to a content of the blue-green phosphor in the phosphor layer by mass of not less than 35 nor more than 50.

Hereinafter, a white lighting device in an embodiment will be specifically explained. The white lighting device in the embodiment includes a semiconductor light-emitting element emitting near-ultraviolet light, and a phosphor layer containing a blue-green phosphor having an emission peak in a wavelength region of not less than 480 nm nor more than 520 nm, a red phosphor having an emission peak in a wavelength region of not less than 585 nm nor more than 630 nm, and two or more phosphors each having an emission peak in a wavelength region other than the above wavelength regions and emits white light having a correlated color temperature of 5000 K or less and a deviation duv from a blackbody locus of not less than −0.01 nor more than 0.01, in which a ratio of a content of the red phosphor to a content of the blue-green phosphor in the phosphor layer by mass is not less than 35 nor more than 50.

Figure 1:
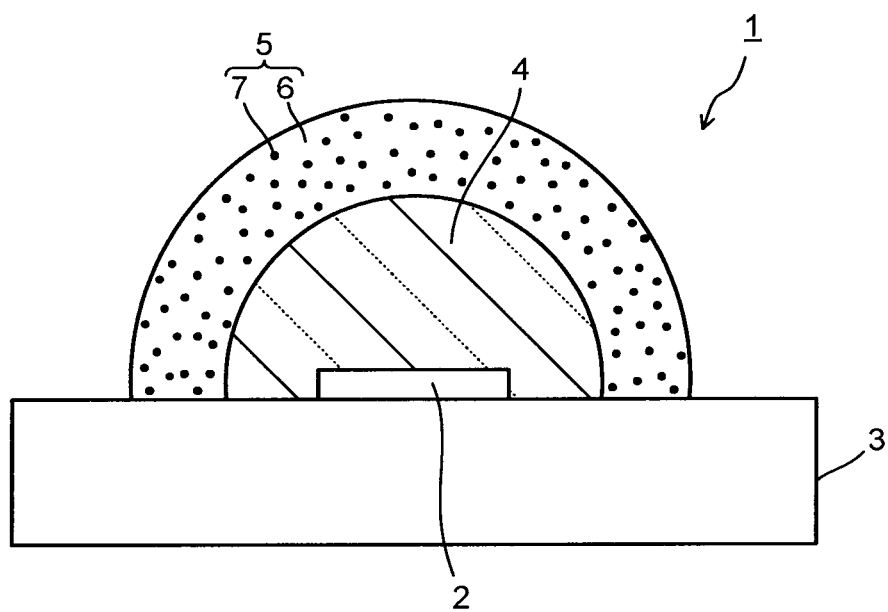
FIG. 1 is a cross-sectional view showing one example of a white lighting device in an embodiment.

FIG. 1 is a cross-sectional view showing one example of the white lighting device in the embodiment. A white lighting device 1 includes a semiconductor light-emitting element (chip) 2 as an excitation source (light source). The semiconductor light-emitting element 2 is to emit near-ultraviolet light, and specifically is to emit light having an emission peak in a wavelength region of not less than 360 nm nor more than 440 nm, preferably not less than 380 nm nor more than 410 nm. As the semiconductor light-emitting element 2, for example, an ultraviolet light-emitting diode, a violet light-emitting diode, an ultraviolet light-emitting laser (laser diode), a violet light-emitting laser (laser diode), or the like is used. As the light-emitting diode among them, for example, a light-emitting diode based on InGaN, GaN, AlGaN, or the like is used.

The semiconductor light-emitting element 2 as above and later-described phosphors are combined, thereby making it possible to fabricate the white lighting device 1 that has the correlated color temperature of 5000 K or less, has a sufficiently high average color rendering index Ra and a sufficiently high special color rendering index R9, and is suitably used for medical lighting, lighting for jewelry goods, lighting for foods, lighting for photographing, and so on.

The semiconductor light-emitting element 2 is mounted on a substrate 3. As the substrate 3, a wiring substrate having a wiring network on its surface and in its inside is used. Although illustration is omitted, electrodes of the semiconductor light-emitting element 2 and the wiring networks of the wiring substrate 3 are electrically connected, and thereby a direct-current voltage is applied to the semiconductor light-emitting element 2.

The semiconductor light-emitting element 2 is covered with a transparent resin layer 4 in order to improve light use efficiency. The transparent resin layer 4 is formed into, for example, a hemispherical shape covering the whole of the semiconductor light-emitting element 2 as illustrated in FIG. 1, but is only needed to be formed so as to cover at least a light-emitting surface of the semiconductor light-emitting element 2. Incidentally, as for the white lighting device 1 in the embodiment, the transparent resin layer 4 is not necessarily needed to be provided, and a later-described phosphor layer 5 may also be directly formed on the semiconductor light-emitting element 2.

On the transparent resin layer 4 covering the semiconductor light-emitting element 2, the phosphor layer 5 is formed. The phosphor layer 5 is that a phosphor 7 for obtaining white light is dispersed in a resin 6 having transparency. The phosphors 7 are to emit white light all together by being excited by light radiated from the semiconductor light-emitting element 2. The transparent resin that forms the transparent resin layer 4 and the phosphor layer 5 is made of a resin having transparency such as, for example, a silicone resin or an epoxy resin.

The phosphors 7 for obtaining white light are constituted by containing at least a blue-green phosphor that absorbs light (for example, ultraviolet light or violet light) radiated from the semiconductor light-emitting element 2 to emit blue-green light and a red phosphor that absorbs light radiated from the semiconductor light-emitting element 2 to emit red light. That is, the phosphors 7 are mixed phosphors that contain at least the blue-green phosphor and the red phosphor. Normally, the phosphors 7 are formed of not only the above-described blue-green phosphor and red phosphor but also a blue phosphor that absorbs light radiated from the semiconductor light-emitting element 2 to emit blue light and a yellow phosphor that absorbs light radiated from the semiconductor light-emitting element 2 to emit yellow light.

The blue-green phosphor is to be excited with light emitted from the semiconductor light-emitting element 2 to emit light having an emission peak in a wavelength region of not less than 480 nm nor more than 520 nm. Similarly, the red phosphor is to emit light having an emission peak in a wavelength region of not less than 585 nm nor more than 630 nm, the blue phosphor is to have an emission peak in a wavelength region of not less than 440 nm nor more than 460 nm, and the yellow phosphor is to have an emission peak in a wavelength region of not less than 525 nm nor more than 575 nm.

The respective color phosphors forming the phosphors 7, namely the blue-green phosphor, the red phosphor, the blue phosphor, and the yellow phosphor may each be made of one type of phosphor, or may also each be made of two types or more of phosphors. Further, the phosphors 7 may also subsidiarily contain a phosphor having an emission color other than the above colors, for example, an orange phosphor, a deep red phosphor, or the like. It is also possible that these blue-green phosphor, red phosphor, blue phosphor, and yellow phosphor are dispersed in the phosphor layer 5 in a state of being previously bound by a binder.

Electric energy applied to the white lighting device 1 is converted into ultraviolet light or violet light by the semiconductor light-emitting element 2. The light emitted from the semiconductor light-emitting element 2 is converted into longer-wavelength light by the phosphors 7 dispersed in the phosphor layer 5. Then, lights emitted from the blue-green phosphor, the red phosphor, the blue phosphor, and the yellow phosphor that form the phosphors 7 are mixed to be emitted, and thereby white light is emitted all together.

The white lighting device 1 in the embodiment uses the phosphors containing at least the blue-green phosphor and the red phosphor as the phosphors 7, and the ratio (the content of the red phosphor/the content of the blue-green phosphor) of the content of the red phosphor to the content of the blue-green phosphor in the phosphor layer 5 (phosphors 7) by mass is set to be not less than 35 nor more than 50. It is set in this manner, and thereby it is possible to fabricate the white lighting device 1 that emits white light having the correlated color temperature of 5000 K or less and the deviation duv from the blackbody locus of not less than −0.01 nor more than 0.01, and to make the average color rendering index Ra and the special color rendering index R9 sufficiently high.

In a conventional combination of phosphors, namely a combination of a red phosphor, a blue phosphor, and a green phosphor, or a combination of a red phosphor, a blue phosphor, and a yellow phosphor, it is possible for one having the correlated color temperature in excess of 5000 K to obtain the sufficient average color rendering index Ra and special color rendering index R9, but it is not necessarily possible for one having the correlated color temperature of 5000 K or less to obtain the sufficient special color rendering index R9. The special color rendering index R9 is a color rendering index for red, and can be improved by increasing the content of a red phosphor, but when the content of a red phosphor is simply increased, the correlated color temperature is likely to be reddish rather than the targeted correlated color temperature.

In the white lighting device 1 in the embodiment, the blue-green phosphor emitting blue-green light, which is a complementary color of red light, is used together, thereby making it possible to increase the content of the red phosphor more than conventionally while suppressing a change from the targeted correlated color temperature. Thereby, for one having the correlated color temperature of 5000 K or less and the deviation duv from the blackbody locus of not less than −0.01 nor more than 0.01, it is possible to obtain the average color rendering index Ra and the special color rendering index R9 that are, for example, 85 or more and more preferably the average color rendering index Ra and the special color rendering index R9 that are 90 or more.

As long as the correlated color temperature is 5000 K or less, it is not necessarily limited, but the correlated color temperature is normally 2600 K or more. Incidentally, the correlated color temperature and the deviation duv from the blackbody locus are specified based on the specification method disclosed in JIS Z8725. Further, the average color rendering index Ra and the special color rendering index R9 are specified based on the method of specifying color rendering properties disclosed in JIS Z8726.

When the ratio of the content of the red phosphor to the content of the blue-green phosphor is less than 35, there is a risk that the sufficiently high special color rendering index R9, which is, for example, 85 or more, cannot be obtained. On the other hand, when the ratio of the content of the red phosphor to the content of the blue-green phosphor exceeds 50, the sufficiently high special color rendering index R9 can be obtained, but the correlated color temperature is likely to be reddish.

The ratio of the content of the red phosphor to the total content of the phosphors 7, namely the total content of the blue-green phosphor, the red phosphor, the blue phosphor, and the yellow phosphor differs according to the targeted correlated color temperature, average color rendering index Ra and special color rendering index R9, and the content ratio of the red phosphor to the blue-green phosphor, but is preferably not less than 45 mass % nor more than 85%, and is more preferably not less than 50 mass % nor more than 80 mass %.

When the ratio of the content of the red phosphor to the total content of the phosphors 7 is less than 45 mass %, there is a risk that the sufficiently high special color rendering index R9 cannot be obtained. On the other hand, when the ratio of the content of the red phosphor to the total content of the phosphors 7 exceeds 85 mass %, the sufficiently high special color rendering index R9 can be obtained, but the correlated color temperature is likely to be reddish.

The ratio of the content of the blue phosphor to the total content of the phosphors 7 and the ratio of the content of the yellow phosphor to the total content of the phosphors 7 also differ according to the targeted correlated color temperature and the like, but the ratio of the content of the blue phosphor is preferably, for example, not less than 10 mass % nor more than 50 mass % and is more preferably not less than 15 mass % nor more than 45 mass %. Further, the ratio of the content of the yellow phosphor is preferably, for example, not less than 1 mass % nor more than 10 mass % and is more preferably not less than 1 mass % nor more than 7 massa.

As long as the blue-green phosphor, the red phosphor, the blue phosphor, and the yellow phosphor each efficiently absorb ultraviolet light or violet light radiated from the semiconductor light-emitting element 2 to emit light having an emission peak in the above-described wavelength region, they are not necessarily limited, but if there is a large illuminance difference among the respective colors, white light in which the color with high illuminance strongly appears is likely to be produced, and further in order to improve the color rendering property of white light, there is a need to enhance a balance of the respective colors. For this reason, as the blue-green phosphor, the red phosphor, the blue phosphor, and the yellow phosphor that form the phosphors 7, ones described below are preferably used in a combined manner.

As the blue-green phosphor, there is suitably used a europium-activated barium strontium orthosilicate phosphor having a composition represented by a general formula:

$$(Ba_{1-x-y}Sr_xEu_y)_2SiO_4 \qquad (1)$$

(in the formula, x is a number satisfying $0 \leq x < 0.5$ and y is a number satisfying $0.005 \leq y < 0.25$).

The europium-activated barium strontium orthosilicate phosphor represented by the general formula (1) as the blue-green phosphor is excellent in absorbency of ultraviolet light or violet light having an emission peak in a wavelength region of not less than 360 nm nor more than 440 nm and can efficiently emit blue-green light being a complementary color for red. This makes it possible to increase the content of the red phosphor to effectively improve the special color rendering index R9 while suppressing that the correlated color temperature becomes reddish.

As the red phosphor, there is suitably used a europium-activated lanthanum oxysulfide phosphor having a composition represented by a general formula:

$$(La_{1-x-y}Eu_xM_y)_2O_2S \qquad (2)$$

(in the formula, M represents at least one type selected from Sm, Ga, Sb, and Sn, and x and y are numbers satisfying $0.008 \leq x < 0.16$ and $0.000001 \leq y < 0.003$).

The europium-activated lanthanum oxysulfide phosphor represented by the general formula (2) as the red phosphor is excellent in absorbency of ultraviolet light or violet light having an emission peak in a wavelength region of not less than 360 nm nor more than 440 nm, and is also excellent in combination with the europium-activated barium strontium orthosilicate phosphor represented by the general formula (1) as the blue-green phosphor.

As the blue phosphor, there is suitably used a europium-activated alkaline earth chlorophosphate phosphor having a composition represented by a general formula:

$$(Sr_{1-x-y}Ba_xCa_yEu_z)_5(PO_4)_3Cl \qquad (3)$$

(in the formula, x, y, and z are numbers satisfying $0 \leq x < 0.45$, $0 \leq y < 0.03$, and $0.005 \leq z < 0.03$).

The europium-activated alkaline earth chlorophosphate phosphor represented by the general formula (3) as the blue phosphor is also excellent in absorbency of ultraviolet light or violet light having an emission peak in a wavelength region of not less than 360 nm nor more than 440 nm, and is also excellent in combination with the europium-activated barium strontium orthosilicate phosphor represented by the general formula (1) as the blue-green phosphor.

Incidentally, as the blue phosphor, it is also possible to use a europium-activated aluminate phosphor having a composition represented by a general formula:

$$(Ba_{1-x-y-z}Sr_xCa_yEu_z)MgAl_{10}O_{17} \qquad (3')$$

(in the formula: x, y, and z are numbers satisfying $0 \leq x < 0.1$, $0 \leq y < 0.1$, and $0.005 \leq z < 0.4$).

As the yellow phosphor, there is suitably used a europium and manganese-activated alkaline earth magnesium silicate phosphor having a composition represented by a general formula:

$$(Sr_{1-x-y-z-u}Ba_xMg_yEu_zMn_u)_2SiO_4 \qquad (4)$$

(in the formula, x, y, z, and u are numbers satisfying $0.1 \leq x < 0.35$, $0.025 \leq y < 0.105$, $0.025 \leq z < 0.25$, and $0.0005 \leq u < 0.02$).

The europium and manganese-activated alkaline earth magnesium silicate phosphor represented by the general formula (4) as the yellow phosphor is excellent in absorbency of ultraviolet light or violet light having an emission peak in a wavelength region of not less than 360 nm nor more than 440 nm as described also in International Publication Pamphlet No. 2008/096545, for example, and further as compared with a conventional yellow phosphor, has a high emission intensity in a range of not less than 600 nm nor more than 700 nm, and can effectively supplement the red light emission. Further, it has a sub-peak in the proximity of 450 nm, thereby being able to supplement also the blue light emission. This makes it possible to make white light excellent in luminance and color rendering property.

The above-described respective color phosphors, namely the blue-green phosphor, the red phosphor, the blue phosphor, and the yellow phosphor each preferably have an average particle diameter of not less than 5 μm nor more than 80 μm. Incidentally, the average particle diameter is set to represent a median (50% value) of particle size distribution. The average particle diameter of the respective color phosphors is set to be not less than 5 μm nor more than 80 μm, thereby making it possible to improve the absorbency of ultraviolet light or violet light having an emission peak in a wavelength region of not less than 360 nm nor more than 440 nm that is emitted from the semiconductor light-emitting element 2 to fabricate the white lighting device 1 having high luminance.

The transparent resin layer 4 preferably has, for example, thickness on the light emitting surface of the semiconductor light-emitting element 2 of not less than 0.4 mm nor more than 10 mm. The thickness of the transparent resin layer 4 is set to 0.4 mm or more, thereby making it possible to effectively improve the light use efficiency. When the thickness of the transparent resin layer 4 exceeds 10 mm, there is a risk that light absorption occurs. Even though the size in the case when the white lighting device 1 is used as a lighting apparatus is considered, the thickness of the transparent resin layer 4 is preferably 10 mm or less.

The thickness of the transparent resin layer 4 is preferably 0.8 mm or more, and further is preferably 1 mm or more. Further, in the case when the transparent resin layer 4 is formed into a hemispherical shape as shown in FIG. 1, the radius of the hemispherical portion is preferably set to be not less than 0.4 mm nor more than 10 mm. Further, the thickness of the phosphor layer formed on the transparent resin layer 4 as above is preferably not less than 0.1 mm nor more than 2.0 mm.

The white lighting device 1 in the embodiment can be fabricated as follows, for example. First, a phosphor slurry containing respective color phosphor powders is prepared. The phosphor slurry can be prepared by, for example, mixing the respective color phosphor powders with resins, respectively, and then mixing the mixtures. Incidentally, the phosphor slurry can also be prepared by previously mixing the respective color phosphor powders, and then mixing the above mixed phosphor powder with the resin.

The mixing ratio of the phosphor powder and the resin can be appropriately selected according to the type and the particle diameter of the phosphor powder, and the resin is preferably set to be not less than 5 parts by mass nor more than 100 parts by mass with respect to 100 parts by mass of the phosphor powder, for example. Incidentally, the mixing ratios of the respective color phosphor powders are preferably adjusted to the ratios of the contents as have been already explained. The mixture of the phosphor powder and the resin can be performed with, for example, a well-known stirrer.

Next, a liquid transparent resin is applied on the semiconductor light-emitting element 2, and is solidified to form the transparent resin layer 4. The phosphor slurry is applied on the layer, and the resin in the phosphor slurry is solidified to form the phosphor layer 5. In this manner, the white lighting device 1 can be fabricated.

The application of the transparent resin and the phosphor slurry can be performed in a manner that, for example, the wiring substrate 3 on which the semiconductor light-emitting element 2 is mounted is put into a mold, and from the above, the transparent resin and the phosphor slurry are supplied with a dispenser. Further, the application of the transparent resin and the phosphor slurry can also be performed by, for example, a printing method, an injection molding method, or the like. When a thermosetting resin is used as the transparent resin and the resin in the phosphor slurry, the transparent resin and the phosphor slurry are applied and then cured by being heated in an oven or the like at a temperature of 100 to 200° C., and thereby the transparent resin layer 4 and the phosphor layer 5 can be formed.

The white lighting device 1 in the embodiment is to emit white light having the correlated color temperature of 5000 K or less and the deviation duv from the blackbody locus of not less than −0.01 nor more than 0.01 and have, for example, the high average color rendering index Ra and special color rendering index R9 each being 85 or more. The white lighting device 1 as above has the sufficiently high average color rendering index Ra and special color rendering index R9, and thus can be suitably used for medical lighting, lighting for jewelry goods, lighting for foods, lighting for photographing, and so on, and can greatly contribute to their saving of energy.

Next, specific examples of the white lighting device in the embodiment and evaluation results thereof will be explained.

Example 1

As the white lighting device, a white lighting device as shown in FIG. 1 was fabricated. First, blue-green phosphor powder, red phosphor powder, blue phosphor powder, and yellow phosphor powder having compositions and average particle diameters as shown in Table 1 were used and were compounded so as to have mixing ratios shown in Table 1 and were mixed to make mixed phosphor powder. 60 parts by mass of a silicone resin was mixed in 40 parts by mass of the above mixed phosphor powder to prepare a phosphor slurry to be the phosphor layer 5.

Next, on a near-ultraviolet light-emitting diode (peak wavelength: 405 nm, chip size: 0.3 mm×0.3 mm×0.1 mm t) as the semiconductor light-emitting element 2, a silicone resin to be the transparent resin layer 4 was applied and then the above-described phosphor slurry was applied. This was heat-treated at a temperature of 140° C. to cure the silicone resin, and thereby the white lighting device emitting white light having the correlated color temperature of 4000 to 5000 K and the deviation duv from the blackbody locus of not less than −0.01 nor more than 0.01 was fabricated. Incidentally, the transparent resin layer was formed into a hemispherical shape, and the radius was set to 0.8 mm. Further, the thickness of the phosphor layer was set to 0.5 mm.

TABLE 1

[NEAR-ULTRAVIOLET LIGHT-EMITTING DIODE 405 nm]
[COMPOUNDING RATIO OF RED PHOSPHOR POWDER TO
BLUE-GREEN PHOSPHOR POWDER BY MASS 41.5]

| | COMPOSITION | MIXING RATIO (PART BY MASS) | AVERAGE PARTICLE DIAMETER (μm) |
|---|---|---|---|
| BLUE PHOSPHOR | $(Sr_{0.59}Ba_{0.39}Ca_{0.01}Eu_{0.01})_5(PO_4)_3Cl$ | 42.5 | 12 |
| BLUE-GREEN PHOSPHOR | $(Ba_{0.6}Sr_{0.3}Eu_{0.1})_2SiO_4$ | 1.3 | 15 |
| YELLOW PHOSPHOR | $(Sr_{0.7}Ba_{0.15}Mg_{0.0975}Eu_{0.05}Mn_{0.0025})_2SiO_4$ | 2.3 | 15 |
| RED PHOSPHOR | $(La_{0.938}Eu_{0.06}Sm_{0.002})_2O_2S$ | 53.9 | 12 |

Example 2

A white lighting device having the correlated color temperature falling within a range of 4000 to 5000 K was fabricated in the same manner as in the example 1 except that, as shown in Table 2, a near-ultraviolet light-emitting diode having an emission peak wavelength of 400 nm was used and red phosphor powder having a different composition was used.

TABLE 2

[NEAR-ULTRAVIOLET LIGHT-EMITTING DIODE 400 nm]
[COMPOUNDING RATIO OF RED PHOSPHOR POWDER TO
BLUE-GREEN PHOSPHOR POWDER
BY MASS 41.5]

| | COMPOSITION | MIXING RATIO (PART BY MASS) | AVERAGE PARTICLE DIAMETER (μm) |
|---|---|---|---|
| BLUE PHOSPHOR | $(Sr_{0.59}Ba_{0.39}Ca_{0.01}Eu_{0.01})_5(PO_4)_3Cl$ | 42.5 | 12 |
| BLUE-GREEN PHOSPHOR | $(Ba_{0.6}Sr_{0.3}Eu_{0.1})_2SiO_4$ | 1.3 | 15 |
| YELLOW PHOSPHOR | $(Sr_{0.7}Ba_{0.15}Mg_{0.0975}Eu_{0.05}Mn_{0.0025})_2SiO_4$ | 2.3 | 15 |
| RED PHOSPHOR | $(La_{0.938}Eu_{0.06}Ga_{0.002})_2O_2S$ | 53.9 | 12 |

Example 3

A white lighting device having the correlated color temperature falling within a range of 4000 to 5000 K was fabricated in the same manner as in the example 1 except that, as shown in Table 3, a near-ultraviolet light-emitting diode having an emission peak wavelength of 395 nm was used and red phosphor powder having a different composition was used.

TABLE 3

[NEAR-ULTRAVIOLET LIGHT-EMITTING DIODE 395 nm]
[COMPOUNDING RATIO OF RED PHOSPHOR POWDER TO
BLUE-GREEN PHOSPHOR POWDER BY MASS 41.5]

| | COMPOSITION | MIXING RATIO (PART BY MASS) | AVERAGE PARTICLE DIAMETER (μm) |
|---|---|---|---|
| BLUE PHOSPHOR | $(Sr_{0.59}Ba_{0.39}Ca_{0.01}Eu_{0.01})_5(PO_4)_3Cl$ | 42.5 | 12 |
| BLUE-GREEN PHOSPHOR | $(Ba_{0.6}Sr_{0.3}Eu_{0.1})_2SiO_4$ | 1.3 | 15 |
| YELLOW PHOSPHOR | $(Sr_{0.7}Ba_{0.15}Mg_{0.0975}Eu_{0.05}Mn_{0.0025})_2SiO_4$ | 2.3 | 15 |
| RED PHOSPHOR | $(La_{0.938}Eu_{0.06}Sb_{0.002})_2O_2S$ | 53.9 | 12 |

Example 4

A white lighting device was fabricated in the same manner as in the example 1 except that, as shown in Table 4, the mixing ratios of the respective color phosphor powders were changed so that the correlated color temperature might fall within a range of 2500 to 4000 K.

TABLE 4

[NEAR-ULTRAVIOLET LIGHT-EMITTING DIODE 405 nm]
[COMPOUNDING RATIO OF RED PHOSPHOR POWDER TO
BLUE-GREEN PHOSPHOR POWDER BY MASS 42.8]

|   | COMPOSITION | MIXING RATIO (PART BY MASS) | AVERAGE PARTICLE DIAMETER ($\mu$m) |
|---|---|---|---|
| BLUE PHOSPHOR | $(Sr_{0.59}Ba_{0.39}Ca_{0.01}Eu_{0.01})_5(PO_4)_3Cl$ | 17.2 | 12 |
| BLUE-GREEN PHOSPHOR | $(Ba_{0.6}Sr_{0.3}Eu_{0.1})_2SiO_4$ | 1.8 | 15 |
| YELLOW PHOSPHOR | $(Sr_{0.7}Ba_{0.15}Mg_{0.0975}Eu_{0.05}Mn_{0.0025})_2SiO_4$ | 4 | 15 |
| RED PHOSPHOR | $(La_{0.938}Eu_{0.06}Sm_{0.002})_2O_2S$ | 77 | 12 |

Example 5

A white lighting device having the correlated color temperature falling within a range of 2500 to 4000 K was fabricated in the same manner as in the example 4 except that, as shown in Table 5, a near-ultraviolet light-emitting diode having an emission peak wavelength of 400 nm was used and red phosphor powder having a different composition was used.

TABLE 5

[NEAR-ULTRAVIOLET LIGHT-EMITTING DIODE 400 nm]
[COMPOUNDING RATIO OF RED PHOSPHOR POWDER TO
BLUE-GREEN PHOSPHOR POWDER BY MASS 42.8]

|   | COMPOSITION | MIXING RATIO (PART BY MASS) | AVERAGE PARTICLE DIAMETER ($\mu$m) |
|---|---|---|---|
| BLUE PHOSPHOR | $(Sr_{0.59}Ba_{0.39}Ca_{0.01}Eu_{0.01})_5(PO_4)_3Cl$ | 17.2 | 12 |
| BLUE-GREEN PHOSPHOR | $(Ba_{0.6}Sr_{0.3}Eu_{0.1})_2SiO_4$ | 1.8 | 15 |
| YELLOW PHOSPHOR | $(Sr_{0.7}Ba_{0.15}Mg_{0.0975}Eu_{0.05}Mn_{0.0025})_2SiO_4$ | 4 | 15 |
| RED PHOSPHOR | $(La_{0.938}Eu_{0.06}Sn_{0.002})_2O_2S$ | 77 | 12 |

Example 6

A white lighting device having the correlated color temperature falling within a range of 4000 to 5000 K was fabricated in the same manner as in the example 1 except that, as shown in Table 6, the mixing ratios of the respective color phosphors were changed so that the mixing ratio of the red phosphor powder to the blue-green phosphor powder might become 35 or so.

TABLE 6

[NEAR-ULTRAVIOLET LIGHT-EMITTING DIODE 405 nm]
[COMPOUNDING RATIO OF RED PHOSPHOR POWDER TO
BLUE-GREEN PHOSPHOR POWDER BY MASS 35.9]

|   | COMPOSITION | MIXING RATIO (PART BY MASS) | AVERAGE PARTICLE DIAMETER ($\mu$m) |
|---|---|---|---|
| BLUE PHOSPHOR | $(Sr_{0.59}Ba_{0.39}Ca_{0.01}Eu_{0.01})_5(PO_4)_3Cl$ | 42.5 | 12 |

TABLE 6-continued

[NEAR-ULTRAVIOLET LIGHT-EMITTING DIODE 405 nm]
[COMPOUNDING RATIO OF RED PHOSPHOR POWDER TO
BLUE-GREEN PHOSPHOR POWDER BY MASS 35.9]

|  | COMPOSITION | MIXING RATIO (PART BY MASS) | AVERAGE PARTICLE DIAMETER (μm) |
|---|---|---|---|
| BLUE-GREEN PHOSPHOR | $(Ba_{0.6}Sr_{0.3}Eu_{0.1})_2SiO_4$ | 1.5 | 15 |
| YELLOW PHOSPHOR | $(Sr_{0.7}Ba_{0.15}Mg_{0.0975}Eu_{0.05}Mn_{0.0025})_2SiO_4$ | 2.1 | 15 |
| RED PHOSPHOR | $(La_{0.938}Eu_{0.06}Sm_{0.002})_2O_2S$ | 53.9 | 12 |

Example 7

A white lighting device was fabricated in the same manner as in the example 1 except that, as shown in Table 7, the mixing ratios of the respective color phosphors were changed so that the correlated color temperature might fall within a range of 2500 to 4000 K and the mixing ratio of the red phosphor powder to the blue-green phosphor powder might become 50 or so.

TABLE 7

[NEAR-ULTRAVIOLET LIGHT-EMITTING DIODE 405 nm]
[COMPOUNDING RATIO OF RED PHOSPHOR POWDER TO
BLUE-GREEN PHOSPHOR POWDER BY MASS 48.9]

|  | COMPOSITION | MIXING RATIO (PART BY MASS) | AVERAGE PARTICLE DIAMETER (μm) |
|---|---|---|---|
| BLUE PHOSPHOR | $(Sr_{0.59}Ba_{0.39}Ca_{0.01}Eu_{0.01})_5(PO_4)_3Cl$ | 16.2 | 12 |
| BLUE-GREEN PHOSPHOR | $(Ba_{0.6}Sr_{0.3}Eu_{0.1})_2SiO_4$ | 1.6 | 15 |
| YELLOW PHOSPHOR | $(Sr_{0.7}Ba_{0.15}Mg_{0.0975}Eu_{0.05}Mn_{0.0025})_2SiO_4$ | 4.2 | 15 |
| RED PHOSPHOR | $(La_{0.938}Eu_{0.06}Sm_{0.002})_2O_2S$ | 78 | 12 |

Comparative Example 1

A white lighting device was fabricated in the same manner as in the example 1 except that, as shown in Table 8, a near-ultraviolet light-emitting diode having an emission peak wavelength of 395 nm was used and only red phosphor powder, blue phosphor powder, and yellow phosphor powder were compounded so that the correlated color temperature might become 4000 to 5000 K.

TABLE 8

[NEAR-ULTRAVIOLET LIGHT-EMITTING DIODE 395 nm]

|  | COMPOSITION | MIXING RATIO (PART BY MASS) | AVERAGE PARTICLE DIAMETER (μm) |
|---|---|---|---|
| BLUE PHOSPHOR | $(Sr_{0.59}Ba_{0.39}Ca_{0.01}Eu_{0.01})_5(PO_4)_3Cl$ | 47.5 | 12 |
| YELLOW PHOSPHOR | $(Sr_{0.7}Ba_{0.15}Mg_{0.0975}Eu_{0.05}Mn_{0.0025})_2SiO_4$ | 2.8 | 15 |
| RED PHOSPHOR | $(La_{0.938}Eu_{0.06}Sm_{0.002})_2O_2S$ | 49.7 | 12 |

Comparative Example 2

A white lighting device was fabricated in the same manner as in the comparative example 1 except that, as shown in Table 9, a near-ultraviolet light-emitting diode having an emission peak wavelength of 405 nm was used and the red phosphor powder, the blue phosphor powder, and the yellow phosphor powder were compounded so that the correlated color temperature might exceed 5000 K.

TABLE 9

| | [NEAR-ULTRAVIOLET LIGHT-EMITTING DIODE 405 nm] | | |
|---|---|---|---|
| | COMPOSITION | MIXING RATIO (PART BY MASS) | AVERAGE PARTICLE DIAMETER (μm) |
| BLUE PHOSPHOR | $(Sr_{0.59}Ba_{0.39}Ca_{0.01}Eu_{0.01})_5(PO_4)_3Cl$ | 52.2 | 12 |
| YELLOW PHOSPHOR | $(Sr_{0.7}Ba_{0.15}Mg_{0.0975}Eu_{0.05}Mn_{0.0025})_2SiO_4$ | 2.8 | 15 |
| RED PHOSPHOR | $(La_{0.938}Eu_{0.06}Sm_{0.002})_2O_2S$ | 45 | 12 |

Comparative Example 3

A white lighting device was fabricated in the same manner as in the comparative example 1 except that, as shown in Table 10, a near-ultraviolet light-emitting diode having an emission peak wavelength of 400 nm was used and the red phosphor powder, the blue phosphor powder, and the yellow phosphor powder were compounded so that the correlated color temperature might exceed 6000 K.

TABLE 10

| | [NEAR-ULTRAVIOLET LIGHT-EMITTING DIODE 400 nm] | | |
|---|---|---|---|
| | COMPOSITION | MIXING RATIO (PART BY MASS) | AVERAGE PARTICLE DIAMETER (μm) |
| BLUE PHOSPHOR | $(Sr_{0.59}Ba_{0.39}Ca_{0.01}Eu_{0.01})_5(PO_4)_3Cl$ | 56.5 | 12 |
| YELLOW PHOSPHOR | $(Sr_{0.7}Ba_{0.15}Mg_{0.0975}Eu_{0.05}Mn_{0.0025})_2SiO_4$ | 2.8 | 15 |
| RED PHOSPHOR | $(La_{0.938}Eu_{0.06}Sm_{0.002})_2O_2S$ | 40.7 | 12 |

Comparative Example 4

A white lighting device was fabricated in the same manner as in the comparative example 1 except that, as shown in Table 11, a near-ultraviolet light-emitting diode having an emission peak wavelength of 405 nm was used and the red phosphor powder, the blue phosphor powder, and the yellow phosphor powder were compounded so that the correlated color temperature might is less than 3000 K.

TABLE 11

| | [NEAR-ULTRAVIOLET LIGHT-EMITTING DIODE 405 nm] | | |
|---|---|---|---|
| | COMPOSITION | MIXING RATIO (PART BY MASS) | AVERAGE PARTICLE DIAMETER (μm) |
| BLUE PHOSPHOR | $(Sr_{0.59}Ba_{0.39}Ca_{0.01}Eu_{0.01})_5(PO_4)_3Cl$ | 27 | 12 |
| YELLOW PHOSPHOR | $(Sr_{0.7}Ba_{0.15}Mg_{0.0975}Eu_{0.05}Mn_{0.0025})_2SiO_4$ | 4 | 15 |
| RED PHOSPHOR | $(La_{0.938}Eu_{0.06}Sm_{0.002})_2O_2S$ | 69 | 12 |

Figure 2:
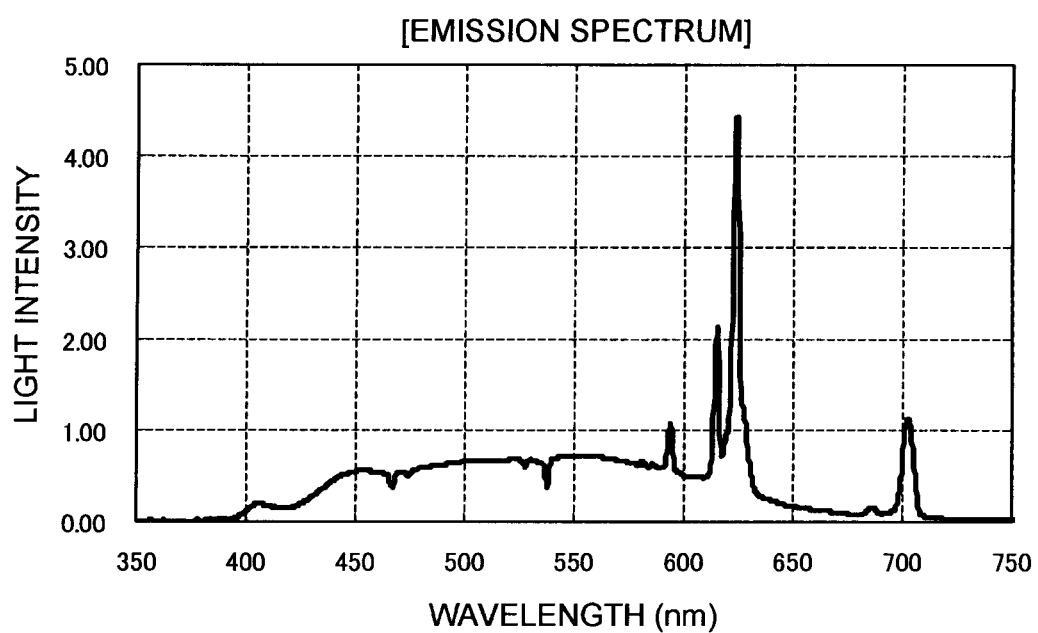
FIG. 2 is a view showing an emission spectrum of a white lighting device in an example 1.

Next, 300 mA current was passed through each of the white lighting devices of the examples and the comparative examples to light them, and the evaluation of a light emitting property was performed. In Table 12, the evaluation results of a luminance flux, a chromaticity coordinate value, and the like of the white lighting device in the example 1 are shown. Further, an emission spectrum of the white lighting device in the example 1 is shown in FIG. 2. Further, in Table 13, there are collectively shown the evaluation results of a color temperature (the correlated color temperature), the deviation duv (deviation duv from the blackbody locus), light emission efficiency, the average color rendering index Ra, and the special color rendering index R9 of the white lighting device of each of the examples and comparative examples. Incidentally, the evaluations were performed by using CAS140 COMPACT ARRAY SPECTROMETER manufactured by Instrument Systems and an MCPD apparatus manufactured By Otsuka Electronics Co., Ltd.

TABLE 12

| ITEM | SYMBOL | CONDITION | RESULT | UNIT |
|---|---|---|---|---|
| FORWARD VOLTAGE | Vf | If = 300 mA | 3.4 | V |
| LUMINOUS FLUX | φv | If = 300 mA | 49.5 | lm |
| CHROMATICITY COORDINATE BASED ON CIE1931 | x | If = 300 mA | 0.373 | — |
| | y | If = 300 mA | 0.375 | — |

TABLE 12-continued

| ITEM | SYMBOL | CONDITION | RESULT | UNIT |
|---|---|---|---|---|
| COLOR TEMPERATURE | — | If = 300 mA | 4185 | K |

TABLE 13

| | COLOR TEMPERATURE (K) | DEVIATION duv | LIGHT EMISSION EFFICIENCY (lm/W) | AVERAGE COLOR RENDERING INDEX Ra | SPECIAL COLOR RENDERING INDEX R9 | RED/BLUE-GREEN COMPOUNDING RATIO* |
|---|---|---|---|---|---|---|
| EXAMPLE 1 | 4185 | −0.0020 | 67.5 | 94.2 | 91 | 41.5 |
| EXAMPLE 2 | 4229 | −0.0015 | 66.2 | 94.0 | 92 | 41.5 |
| EXAMPLE 3 | 4231 | 0.0011 | 68.2 | 94.1 | 91 | 41.5 |
| EXAMPLE 4 | 2810 | 0.0008 | 59.2 | 93.1 | 92 | 42.8 |
| EXAMPLE 5 | 2805 | 0.0019 | 56.4 | 92.9 | 91 | 42.8 |
| EXAMPLE 6 | 4600 | 0.0051 | 68.5 | 90.4 | 90 | 35.9 |
| EXAMPLE 7 | 3010 | 0.0045 | 59.4 | 90.2 | 90 | 48.9 |
| COMPARATIVE EXAMPLE 1 | 4220 | −0.0012 | 65.9 | 92.9 | 41 | — |
| COMPARATIVE EXAMPLE 2 | 5800 | −0.0023 | 66.5 | 94.6 | 90 | — |
| COMPARATIVE EXAMPLE 3 | 6500 | −0.0025 | 66.5 | 93.9 | 92 | — |
| COMPARATIVE EXAMPLE 4 | 2958 | 0.0010 | 58.2 | 95.0 | 48 | — |

*COMPOUNDING RATIO OF RED PHOSPHOR POWDER TO BLUE-GREEN PHOSPHOR POWDER BY MASS

As is clear from Table 13, it is found that even in the case of only the red phosphor powder, the blue phosphor powder, and the yellow phosphor powder being used, the white lighting device having the correlated color temperature in excess of 5000 K can obtain the average color rendering index Ra and the special color rendering index R9 each being 90 or more (the comparative examples 2 and 3). However, it is found that the white lighting device having the correlated color temperature of 5000 K or less can obtain the average color rendering index Ra of 90 or more, but cannot obtain the special color rendering index R9 in excess of 50 (the comparative examples 1 and 4).

On the other hand, it is found that the white lighting devices in the examples each using the blue-green phosphor powder together, having the ratio of the content of the red phosphor powder to the content of the blue-green phosphor powder set to fall within a predetermined range, and having the correlated color temperature of 5000 K or less can obtain the average color rendering index Ra and the special color rendering index R9 each being 90 or more.

In the foregoing, while certain embodiments of the present invention have been described, these embodiments have been presented by way of example only, and are not intended to limit the scope of the inventions. Indeed, the novel methods described herein may be embodied in a variety of other forms; furthermore, various omissions, substitutions and changes in the form of the methods described herein may be made without departing from the spirit of the inventions. The accompanying claims and their equivalents are intended to cover such forms or modifications as would fall within the scope and spirit of the inventions.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A white lighting device, comprising:
a semiconductor light-emitting element emitting near-ultraviolet light; and
a phosphor layer containing a blue-green phosphor having an emission peak in a wavelength region of not less than 480 nm nor more than 520 nm, a red phosphor having an emission peak in a wavelength region of not less than 585 nm nor more than 630 nm, and two or more phosphors each having an emission peak in a wavelength region other than the wavelength regions and emits white light having a correlated color temperature of 5000 K or less and a deviation duv from a blackbody locus of not less than −0.01 nor more than 0.01,
wherein a ratio of a content of the red phosphor to a content of the blue-green phosphor in the phosphor layer by mass is not less than 35 nor more than 50.

2. The white lighting device according to claim 1,
wherein the blue-green phosphor is made of a europium-activated barium strontium orthosilicate phosphor having a composition represented by a general formula:

$$(Ba_{1-x-y}Sr_xEu_y)_2SiO_4 \qquad (1)$$

where, x is a number satisfying $0 \leq x < 0.5$ and y is a number satisfying $0.005 \leq y < 0.25$.

3. The white lighting device according to claim 1,
wherein the red phosphor is made of a europium-activated lanthanum oxysulfide phosphor having a composition represented by a general formula:

$$(La_{1-x-y}Eu_xM_y)_2O_2S \qquad (2)$$

where, M represents at least one element selected from Sm, Ga, Sb, and Sn, and x and y are numbers satisfying $0.008 \leq x < 0.16$ and $0.000001 \leq y < 0.003$.

4. The white lighting device according to claim 1, wherein an average color rendering index Ra of the white light is equal to or more than 85 and a special color rendering index R9 of the white light is equal to or more than 85.

5. The white lighting device according to claim 1, wherein an average color rendering index Ra of the white light is equal to or more than 90 and a special color rendering index R9 of the white light is equal to or more than 90.

6. The white lighting device according to claim 1, wherein the semiconductor light-emitting element has an emission peak in a wavelength region of not less than 360 nm nor more than 440 nm.

7. The white lighting device according to claim 1, wherein the semiconductor light-emitting element is a light-emitting diode or a laser diode.

8. The white lighting device according to claim 1, wherein the two or more phosphors are a blue phosphor having an emission peak in a wavelength region of not less than 440 nm nor more than 460 nm and a yellow phosphor having an emission peak in a wavelength region of not less than 525 nm nor more than 575 nm.

9. The white lighting device according to claim 8, wherein the blue phosphor is made of a europium-activated alkaline earth chlorophosphate phosphor having a composition represented by a general formula:

$$(Sr_{1-x-y-z}Ba_xCa_yEu_z)_5(PO_4)_3Cl \qquad (3)$$

where, x, y, and z are numbers satisfying $0 \leq x < 0.45$, $0 \leq y < 0.03$, and $0.005 \leq z < 0.03$.

10. The white lighting device according to claim 8, wherein the yellow phosphor is made of a europium and manganese-activated alkaline earth magnesium silicate phosphor having a composition represented by a general formula:

$$(Sr_{1-x-y-z-u}Ba_xMg_yEu_zMn_u)_2SiO_4 \qquad (4)$$

where, x, y, z and u are numbers satisfying $0.1 \leq x < 0.35$, $0.025 \leq y < 0.105$, $0.025 \leq z < 0.25$, and $0.0005 \leq u < 0.02$.

* * * * *